(12) United States Patent
Kuo et al.

(10) Patent No.: US 6,712,260 B1
(45) Date of Patent: Mar. 30, 2004

(54) BUMP REFLOW METHOD BY INERT GAS PLASMA

(75) Inventors: Wen-Chang Kuo, Hsin-Chu (TW); Chia-Fu Lin, Hsin-Chu (TW); Sheng-Liang Pan, Hsin-Chu (TW); Szu-Yao Wang, Hsin-Chu (TW); Cheng-Yu Chu, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 27 days.

(21) Appl. No.: 10/124,998

(22) Filed: Apr. 18, 2002

(51) Int. Cl.[7] .................... B23K 31/02; B23K 35/38; H01L 21/44
(52) U.S. Cl. .............. 228/180.22; 228/205; 228/219; 228/220; 438/613
(58) Field of Search ................... 228/180.22, 205, 228/203, 206, 219, 220, 245, 246, 254; 257/737, 738; 438/613

(56) References Cited

U.S. PATENT DOCUMENTS

| 4,865,245 A | * | 9/1989 | Schulte et al. ............. 228/116 |
| 4,921,157 A | * | 5/1990 | Dishon et al. ............ 228/124.1 |
| 5,125,560 A | | 6/1992 | Degani et al. ............. 228/223 |
| 5,341,980 A | * | 8/1994 | Nishikawa et al. ......... 228/205 |
| 5,470,787 A | * | 11/1995 | Greer ........................ 438/614 |
| 5,499,668 A | | 3/1996 | Katayama et al. ............. 134/1 |
| 5,516,031 A | | 5/1996 | Nishikawa et al. ......... 228/205 |
| 6,042,953 A | * | 3/2000 | Yamaguchi et al. ......... 428/652 |
| 6,114,187 A | | 9/2000 | Hayes ........................ 438/106 |
| 6,121,062 A | | 9/2000 | Karasawa et al. ............. 438/15 |
| 6,179,200 B1 | | 1/2001 | Kung et al. ................. 228/254 |
| 6,468,917 B1 | * | 10/2002 | Li et al. ..................... 438/712 |
| 6,471,115 B1 | * | 10/2002 | Ijuin et al. ............. 228/180.22 |
| 6,541,366 B1 | * | 4/2003 | Chin et al. .................. 438/613 |
| 2001/0015261 A1 | * | 8/2001 | Kobayashi et al. |
| 2001/0042923 A1 | * | 11/2001 | Yanagida |
| 2002/0064930 A1 | * | 5/2002 | Ishikawa |
| 2003/0019917 A1 | * | 1/2003 | Furuno et al. |

FOREIGN PATENT DOCUMENTS

| JP | 405235061 A | * | 9/1993 |
| JP | 02000049450 A | * | 2/2000 |

* cited by examiner

*Primary Examiner*—Kiley Stoner
(74) *Attorney, Agent, or Firm*—George O. Saile; Stephen B. Ackerman; Stephen G. Stanton

(57) ABSTRACT

A method of forming reflowed bumps comprising the following sequential steps. A wafer is provided. A series of spaced initial bumps is formed upon the wafer. The initial bumps having exposed side walls and top surfaces and organic residue over the initial bump side walls and/or the initial bump top surfaces. The organic residue is simultaneously removed from the initial bump side walls and top surfaces with the forming a surface oxide layer over the initial bump side walls and top surfaces. The surface oxide layer is stripped from the initial bump top surfaces and an upper portion of the initial bump side walls to form partially exposed bumps. The partially exposed bumps are heat treated to melt the partially exposed bumps to form the reflowed bumps.

61 Claims, 2 Drawing Sheets

BUMP REFLOW METHOD BY INERT GAS PLASMA

FIELD OF THE INVENTION

The present invention relates generally to semiconductor fabrication and more specifically to processes of reflowing bumps.

BACKGROUND OF THE INVENTION

Current bump reflow methods requires many machines such as flux coaters, reflow furnaces flux cleaners to do bump flux reflow. A flux chemical is required which is a pollution source. The reflowed bump height is low with a large diameter.

U.S. Pat. No. 6,179,200 B1 to Kung et al. describes a solder bump process.

U.S. Pat. No. 6,121,062 to Karasawa et al. describes another molder bump process.

U.S. Pat. No. 6,114,187 to Hayes describes a solder reflow process.

U.S. Pat. No. 5,125,560 to Degani et al. describes a solder reflow process using a flux.

SUMMARY OF THE INVENTION

Accordingly, it is an object of one or more embodiments of the present invention to provide an improved method of reflowing bumps.

Other objects will appear hereinafter.

It has now been discovered that the above and other objects of the present invention may be accomplished in the following manner. Specifically, a wafer is provided. A series of spaced initial bumps is formed upon the wafer. The initial bumps having exposed side walls and top surfaces and organic residue over the initial bump side walls and/or the initial bump top surfaces. The organic residue is simultaneously removed from the initial bump side walls and top surfaces with the forming a surface oxide layer over the initial bump side walls and top surfaces. The surface oxide layer is stripped from the initial bump top surfaces and an upper portion of the initial bump side walls to form partially exposed bumps. The partially exposed bumps are heat treated to melt the partially exposed bumps to form the reflowed bumps.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

Initial Structure

Figure 1:
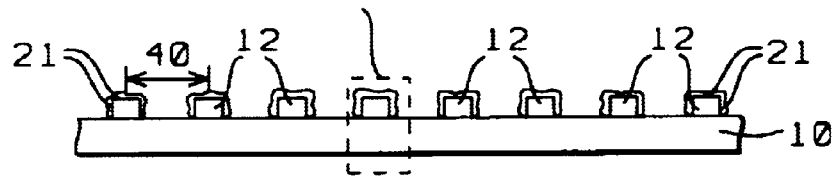
FIGS. 1 to 4 schematically illustrate a preferred embodiment of the present invention, with FIG. 2 being an enlarged view of FIG. 1 at box "FIG. 2" and FIGS. 3 and 4 being of the same scale as FIG. 2.

As shown in FIG. 1, initial bumps 12 are formed upon wafer 10. Initial bumps 12 are preferably comprised of Pb/Sn or Sn/In.

Wafer 10 is understood to possible include a semiconductor wafer or substrate, active and passive devices formed within the wafer 10, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

As shown in FIG. 1, initial bumps 12 may have organic residue 21 over their exposed surfaces.

Figure 2:
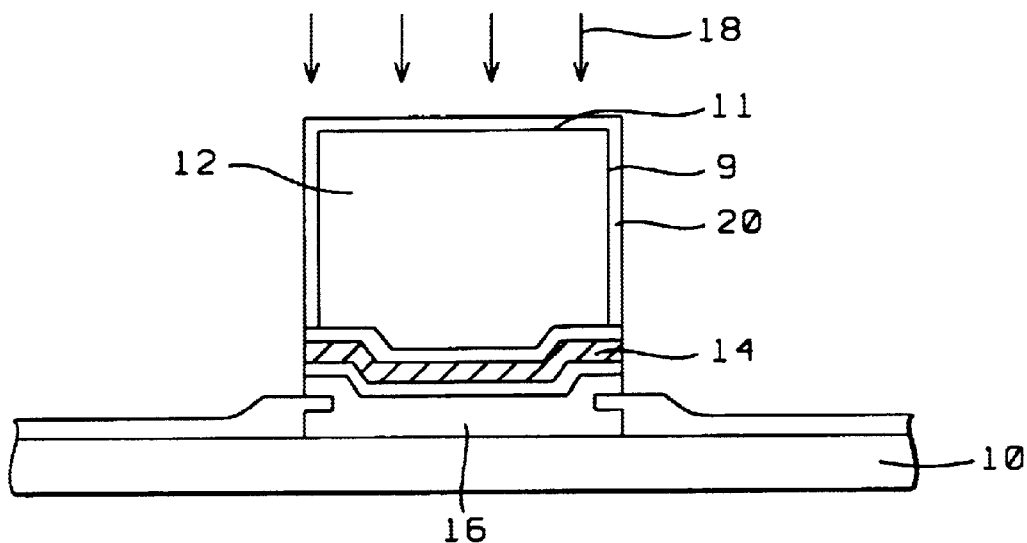

FIG. 2 is an enlarged portion of FIG. 1 taken along the dashed line box labeled "FIG. 2". FIG. 2 illustrates details of the structures proximate initial bumps 12 such as under-bump metal 14 and pad 16.

Oxygen Gas Plasma Treatment 18

As shown in FIG. 2, an oxygen gas plasma treatment 18 is used to: (1) clean initial bumps 12 of, for example, any organic residue 21 over the exposed surfaces 9, 11 of bumps 12; and (2) to grow a layer of surface oxide 20 over the cleaned, exposed side walls 9 and top surface 11 of initial bumps 12. Surface oxide layer 20 is formed to a thickness of preferably from about 5 to 30 Å and more preferably from about 10 to 20 Å. It is noted that surface oxide layer 20 may be native oxide.

If there is no organic residue 21 over the exposed surfaces 9, 11 of bumps 12, then the oxygen gas plasma treatment 18 may not be used, as the surface oxide layer 20 may also be simple native oxide.

Oxygen gas plasma treatment 18 is conducted at the following parameters:

oxygen flow: preferably from about 500 to 9000 sccm and more preferable from about 2000 to 5000 sccm;

power: preferable from about 500 to 3000 watts and more preferably from about 1000 to 2000 watts;

pressure: preferably from about 200 to 3000 mTorr and more preferably from about 500 to 1500 mTorr; and time: preferable from about 10 to 300 seconds and more preferably from about 60 to 120 seconds.

Inert Gas Plasma Treatment 22

Figure 3:
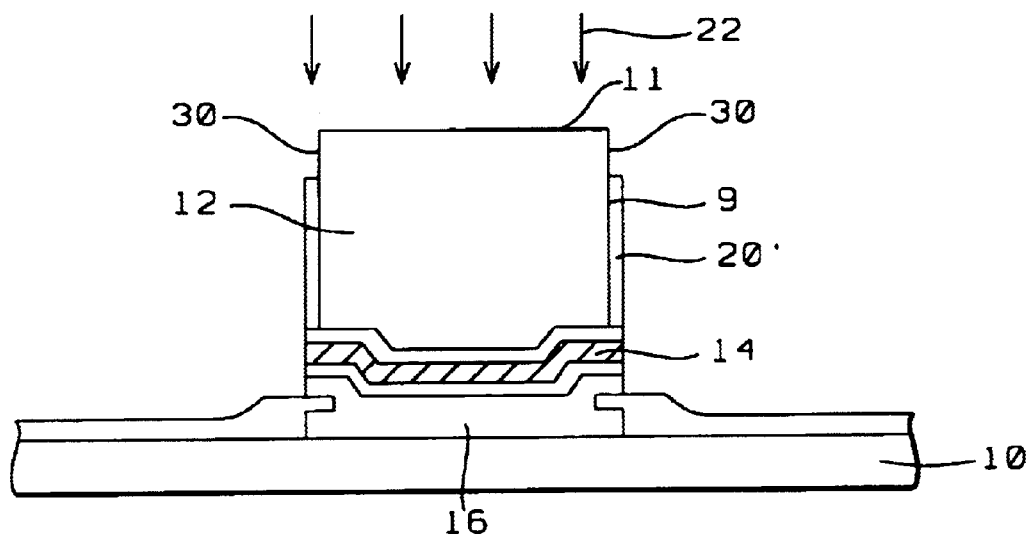

As shown in FIG. 3, an inert gas plasma treatment 22 is used to strip the surface oxide layer 20 tram the top surface 11 of initial bumps 12 and from the upper portion 30 of the side walls 9 of initial bumps 12 to form partially removed surface oxide layer 20 and partially exposed initial bumps 12'. Upper portions 30 of bump side walls 9 extend preferably from about 3 to 100 $\mu$m from the top surface 11 and more preferably from about 5 to 15 $\mu$m from the top surface 11.

The length of portion 30 is used to determine the final height 42 and diameter 44 of the reflowed bumps 12". The length of portion 30 may be varied as required to form the required height 42/diameter 44/pitch 40 of reflowed bumps 12".

The inert gas plasma treatment 22 preferably includes nitrogen ($N_2$), argon (Ar) or nitrogen/hydrogen ($N_2/H_2$) forming gas and more preferably includes $N_2/H_2$ gas. The inert gas plasma treatment 22 is conducted at the following parameters at a relatively low power;

inert gas flows: preferably from about 100 to 2000 sccm and more preferably from about 500 to 1000 sccm;

power: preferably from about 500 to 3000 watts and more preferably from about 1000 to 2000 watts;

pressure: preferable from about 200 to 3000 mTorr and more preferably from about 500 to 1500 mTorr; and time: preferable from about 10 to 300 seconds and more preferable from about 60 to 120 seconds.

Inert Gas Plasma Heating Treatment 24

Figure 4:
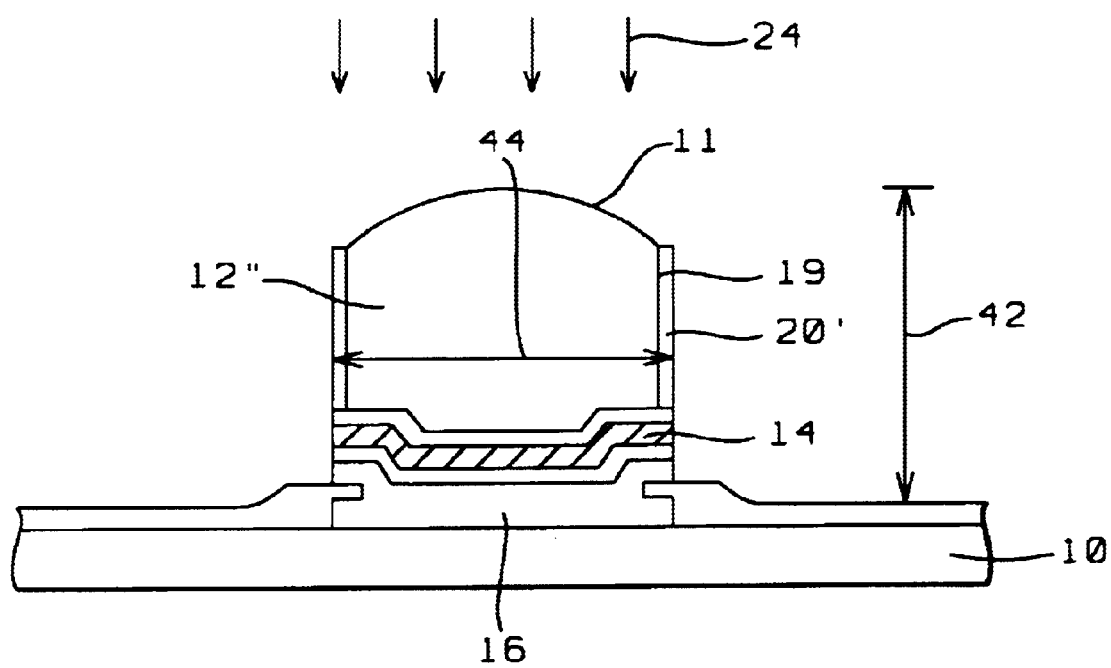

As shown in FIG. 4, an in situ inert gas plasma heating treatment 24 is used to reflow the exposed bumps 12' to form reflowed bumps 12". By using the partially removed surface oxide layer 20', the reflowed bumps 12" have a higher height 42 and smaller diameter 44 than conventionally formed reflowed bumps.

The inert gas plasma heating treatment 24 is performed in situ vis a via the inert gas plasma treatment 22 to avoid formation of any surface oxide on the exposed portion of the partially exposed bump 12'.

The inert gas plasma heating treatment 24 preferable includes nitrogen ($N_2$), argon (Ar) or a nitrogen hydrogen ($N_2/H_2$) forming gas and more preferable includes an $N_2/H_2$ forming gas. The inert gas plasma heating treatment 24 is conducted at the following parameters at high power;

inert gas flow: preferably from about 100 to 2000 sccm and more preferably from about 500 to 1000 sccm;

power: preferable from about 1000 to 4000 watts and more preferably from about 1500 to 3000 watts;

temperature: preferable from about 100 to 1000° C. and more preferable front about 200 to 400° C.;

pressure: preferable from about 200 to 3000 mTorr; and more preferable from about 500 to 1500 mTorr; and time: preferably from about 60 to 300 seconds and more preferably from about 120 to 240 seconds.

Cool Down of Wafer 10 with the Reflowed Burns 12"

Wafer 10, with the reflowed bumps 12", is then cooled down to a temperature of preferably from about 20 to 150° C. and more preferable from about 40 to 60° C.

Advantages of the Present Invention

The advantages of one or more embodiments of the present invention include:

1. the oxygen gas plasma treatment simultaneously cleans and forms an surface oxide layer over the bumps;
2. the upper surfaces of the bumps are cleaned using a lower power inert gas plasma treatment;
3. the height or reflowed bumps may be increased;
4. the diameter of the reflowed bumps are decreased; and
5. the clearance between the reflowed bump is increased.

While particular embodiments of the present invention have been illustrated and described, it is not intended to limit the invention, except as defined by the following claims.

What is claimed is:

1. A method of forming reflowed bumps, comprising the sequential steps of:

providing a wafer;

forming a series of spaced initial bumps upon the wafer; the initial bumps having exposed side walls and top surfaces and organic residue over the initial bump side walls and/or the initial bump top surfaces;

simultaneously removing the organic residue from the initial bump side walls and top surfaces and forming a surface oxide layer over the initial bump side walls and top surfaces;

stripping the surface oxide layer from the initial bump top surfaces and an upper portion of the initial bump side walls to form partially exposed bumps; and heat treating the partially exposed bumps to melt the partially exposed bumps to form the reflowed bumps.

2. The method of claim 1, wherein simultaneous removal of the organic residue from the initial bump side walls and top surfaces and the formation a surface oxide layer over the initial bump side walls and top surfaces is accomplished using an oxygen gas plasma treatment.

3. The method of claim 1, wherein simultaneous removal of the organic residue from the initial bump side walls and top surfaces and the formation a surface oxide layer over the initial bump side walls and top surfaces is accomplished using an oxygen gas plasma treatment at the following parameters:

oxygen flow: from about 500 to 9000 sccm;

power: from about 500 to 3000 watts;

pressure: from about 200 to 3000 mTorr; and time: from about 10 to 300 seconds.

4. The method of claim 1, wherein simultaneous removal of the organic residue from the initial bump side walls and top surfaces and the formation a surface oxide layer over the initial bump side walls and top surfaces is accomplished using an oxygen gas plasma treatment at the following parameters:

oxygen flow: from about 2000 to 5000 sccm;

power: from about 1000 to 2000 watts;

pressure: from about 500 to 1500 mTorr; and time: from about 60 to 120 seconds.

5. The method of claim 1, wherein the partially exposed bumps are formed using an inert gas plasma treatment.

6. The method of claim 1, wherein the partially exposed bumps are formed using an gas plasma treatment including an gas selected from the group consisting of: nitrogen; argon; and an nitrogen/hydrogen forming gas.

7. The method of claim 1, wherein the partially exposed bumps are formed using an gas plasma treatment including an $N_2/H_2$ gas.

8. The method of claim 1, wherein the partially exposed bumps are formed using a gas or an inert gas plasma treatment at the following parameters:

inert gas flow: from about 100 to 2000 sccm;

power: from about 500 to 3000 watts;

pressure: from about 200 to 3000 mTorr; and time: from about 10 to 300 seconds.

9. The method of claim 1, wherein the partially exposed bumps are formed using a gas or an inert gas plasma treatment at the following parameters:

inert gas flow: from about 500 to 1000 sccm;

power: from about 1000 to 2000 watts;

pressure: from about 500 to 1500 mTorr; and time: from about 60 to 120 seconds.

10. The method of claim 1, wherein the reflowed bumps are formed using a gas or an inert gas heating treatment.

11. The method of claim 1, wherein the reflowed bumps are formed using an gas heating treatment including a gas selected from the group consisting of: nitrogen, argon and nitrogen/hydrogen.

12. The method of claim 1, wherein the reflowed bumps are formed using an gas heating treatment including a nitrogen/hydrogen gas.

13. The method of claim 1, wherein, the reflowed bumps are formed using a gas or an inert gas heating treatment conducted at the following parameters:

inert gas flow: from about 100 to 2000 sccm;

power: from about 1000 to 4000 watts;

temperature: from about 100 to 1000° C.;

pressure: from about 200 to 3000 mTorr; and time: from about 60 to 300 seconds.

14. The method of claim 1, wherein the reflowed bumps are formed using a gas or an inert gas heating treatment conducted at the following parameters:

inert gas flow: from about 500 to 1000 sccm;
power: from about 1500 to 3000 watts;
temperature: from about 200 to 400° C.;
pressure: from about 500 to 1500 mTorr; and
time: from about 120 to 240 seconds.

15. The method of claim 1, wherein the surface oxide layer is from about 5 to 30 Å thick.

16. The method of claim 1, wherein the surface oxide layer is from about 10 to 20 Å thick.

17. The method of claim 1, wherein the exposed upper portion of the initial bump side walls extends from about 3 to 100 μm from the initial bump top surfaces.

18. The method of claim 1, wherein the exposed upper portion of the initial bump side walls extends from about 5 to 15 μm from the initial bump top surfaces.

19. A method of forming reflowed bumps, comprising the sequential steps of:
providing a wafer;
forming a series of spaced initial bumps upon the wafer; the initial bumps having exposed side walls and top surfaces and organic residue over the initial bump side walls and/or the initial bump top surfaces;
using an oxygen gas plasma treatment to simultaneously removing the organic residue from the initial bump side walls and top surfaces and forming a surface oxide layer over the initial bump side walls and top surfaces;
using a gas or an inert plasma gas treatment to strip the surface oxide layer from the initial bump top surfaces and an upper portion of the initial bump side walls to form partially exposed bumps; and
using a gas or an inert gas heating treatment to melt the partially exposed bumps to form the reflowed bumps.

20. The method of claim 19, wherein the oxygen gas plasma treatment is conducted at the following parameters:
oxygen flow: from about 500 to 9000 sccm;
power: from about 500 to 3000 watts;
pressure: from about 200 to 3000 mTorr; and
time: from about 10 to 300 seconds.

21. The method of claim 19, wherein the oxygen gas plasma treatment is conducted at the following parameters:
oxygen flow: from about 2000 to 5000 sccm;
power: from about 1000 to 2000 watts;
pressure: from about 500 to 1500 mTorr; and
time: from about 60 to 120 seconds.

22. The method of claim 19, wherein the gas plasma treatment includes an gas selected from the group consisting of: nitrogen; argon; and an nitrogen/hydrogen forming gas.

23. The method of claim 19, wherein the an gas plasma treatment includes an $N_2/H_2$ gas.

24. The method of claim 19, wherein the gas or inert gas plasma treatment is conducted at the following parameters:
inert gas flow: from about 100 to 2000 sccm;
power: from about 500 to 3000 watts;
pressure: from about 200 to 3000 mTorr; and
time: from about 10 to 300 seconds.

25. The method of claim 19, wherein the gas or inert gas plasma treatment is conducted at the following parameters:
inert gas flow: from about 500 to 1000 sccm;
power: from about 1000 to 2000 watts;
pressure: from about 500 to 1500 mTorr; and
time: from about 60 to 120 seconds.

26. The method of claim 19, wherein the gas heating treatment includes a gas selected from the group consisting of: nitrogen, argon and nitrogen/hydrogen.

27. The method of claim 19, wherein the gas heating treatment includes a nitrogen/hydrogen gas.

28. The method of claim 19, wherein the gas or inert gas heating treatment is conducted at the following parameters:
inert gas flow: from about 100 to 2000 sccm;
power: from about 1000 to 4000 watts;
temperature: from about 100 to 1000° C.;
pressure: from about 200 to 3000 mTorr; and
time: from about 60 to 300 seconds.

29. The method of claim 19, wherein the gas or inert gas heating treatment is conducted at the following parameters:
inert gas flow: from about 500 to 1000 sccm;
power: from about 1500 to 3000 watts;
temperature: from about 200 to 400° C.;
pressure: from about 300 to 1500 mTorr; and
time: from about 120 to 240 seconds.

30. The method of claim 19, wherein the surface oxide layer is from about 5 to 30 Å thick.

31. The method of claim 19, wherein the surface oxide layer is from about 10 to 20 Å thick.

32. The method of claim 19, wherein the exposed upper portion of the initial bump side walls extends from about 3 to 100 μm from the initial bump top surfaces.

33. The method of claim 19, wherein the exposed upper portion of the initial bump side walls extends from about 5 to 15 μm from the initial bump top surfaces.

34. A method of forming reflowed bumps, comprising the sequential steps of:
providing a wafer;
forming a series of spaced initial bumps upon the wafer; the initial bumps having exposed side walls and top surfaces and organic residue over the initial bump side walls and/or the initial bump top surfaces;
using an oxygen gas plasma treatment to simultaneously removing the organic residue from the initial bump side walls and top surfaces and forming a surface oxide layer over the initial bump side walls and top surfaces;
using a gas or an inert plasma gas treatment to strip the surface oxide layer from the initial bump top surfaces and an upper portion of the initial bump side walls to form partially exposed bumps; the inert gas plasma treatment including an inert gas selected from the group consisting of: nitrogen; argon; and an nitrogen/ hydrogen forming gas; and
using a gas or an inert gas heating treatment to reflow the exposed portions of the partially exposed bumps to form the reflowed bumps; the inert gas heating treatment includes a gas selected from the group consisting of: nitrogen, argon and nitrogen/hydrogen.

35. The method of claim 34, wherein the oxygen gas plasma treatment is conducted at the following parameters:
oxygen flow: from about 500 to 9000 sccm;
power: from about 500 to 3000 watts,;
pressure: from about 200 to 3000 mTorr; and
time: from about 10 to 300 seconds.

36. The method of claim 34, wherein the oxygen gas plasma treatment is conducted at the following parameters:
oxygen flow: from about 2000 to 5000 sccm;
power: from about 1000 to 2000 watts;
pressure: from about 500 to 1500 mTorr; and
time: from about 60 to 120 seconds.

37. The method of claim 34, wherein the an gas plasma treatment includes an $N_2/H_2$ gas.

38. The method of claim 34, wherein the gas or inert gas plasma treatment is conducted at the following parameters:
   inert gas flow: from about 100 to 2000 sccm;
   power: from about 500 to 3000 watts;
   pressure: from about 200 to 3000 mTorr, and
   time: from about 10 to 300 seconds.

39. The method of claim 34, wherein the gas or inert gas plasma treatment is conducted at the following parameters:
   inert gas flow: from about 500 to 1000 sccm;
   power: from about 1000 to 2000 watts;
   pressure: from about 500 to 1500 mTorr; and
   time: from about 60 to 120 seconds.

40. The method of claim 34, wherein the gas heating treatment includes a nitrogen/hydrogen gas.

41. The method of claim 34, wherein the gas or inert gas heating treatment is conducted at the following parameters:
   inert gas flow: from about 100 to 2000 sccm;
   power: from about 1000 to 4000 watts;
   temperature: from about 100 to 1000° C.;
   pressure: from about 200 to 3000 mTorr; and
   time: from about 60 to 300 seconds.

42. The method of claim 34, wherein the gas or inert gas heating treatment is conducted at the following parameters:
   inert gas flow: from about 500 to 1000 sccm;
   power: from about 1500 to 3000 watts;
   temperature: from about 200 to 400° C.;
   pressure: from about 500 to 1500 mTorr; and
   time: from about 120 to 240 seconds.

43. The method of claim 34, wherein the surface oxide layer is from about 5 to 30 Å thick.

44. The method of claim 34, wherein the surface oxide layer is from about 10 to 20 Å thick.

45. The method of claim 34, wherein the exposed upper portion of the initial bump side walls extends from about 3 to 100 μm from the initial bump top surfaces.

46. The method of claim 34, wherein the exposed upper portion of the initial bump side walls extends from about 5 to 15 μm from the initial bump top surfaces.

47. A method of forming reflowed bumps, comprising the sequential steps of:
   providing a wafer;
   forming a series of spaced initial bumps upon the wafer; the initial bumps having exposed side walls and top surfaces;
   forming a surface native oxide layer over the initial bump side walls and top surfaces;
   stripping the surface native oxide layer from the initial bump top surfaces and an upper portion of the initial bump side walls to form partially exposed bumps; each of the bumps having a lower portion covered by the remaining surface native oxide; and
   heat treating the partially exposed bumps to melt the partially exposed bumps to form the reflowed bumps.

48. The method of claim 47, wherein the partially exposed bumps are formed using a gas or an inert gas plasma treatment.

49. The method of claim 47, wherein the partially exposed bumps are formed using an inert gas plasma treatment including a gas or an inert gas selected from the group consisting of: nitrogen; argon; and an nitrogen/hydrogen forming gas.

50. The method of claim 47, wherein the partially exposed bumps are formed using an gas plasma treatment including an $N_2/H_2$ gas.

51. The method of claim 47, wherein the partially exposed bumps are formed using a gas or an inert gas plasma treatment at the following parameters:
   inert gas flow: from about 100 to 2000 sccm;
   power: from about 500 to 3000 watts;
   pressure: from about 200 to 3000 mTorr; and
   time; from about 10 to 300 seconds.

52. The method of claim 47, wherein the partially exposed bumps are formed using an inert gas plasma treatment at the following; parameters:
   inert gas flow: from about 500 to 1000 sccm;
   power: from about 1000 to 2000 watts;
   pressure: from about 500 to 1500 mTorr; and
   time: from about 60 to 120 seconds.

53. The method of claim 47, wherein the reflowed bumps are formed using a gas or an inert gas heating treatment.

54. The method of claim 47, wherein the reflowed bumps are formed using an gas heating treatment including a gas selected from the group consisting of: nitrogen, argon and nitrogen/hydrogen.

55. The method of claim 47, wherein the reflowed bumps are formed using an gas heating treatment including a nitrogen/hydrogen gas.

56. The method of claim 47, wherein the reflowed bumps are formed using a gas or an inert gas heating treatment conducted at the following parameters:
   inert gas flow: from about 100 to 2000 sccm;
   power: from about 1000 to 4000 watts;
   temperature: from about 100 to 1000° C.;
   pressure: from about 200 to 3000 mTorr; and
   time: from about 60 to 300 seconds.

57. The method of claim 47, wherein the reflowed bumps are formed using a gas or an inert gas heating treatment conducted at the following parameters:
   inert gas flow: from about 500 to 1000 sccm;
   power: from about 1500 to 3000 watts;
   temperature: from about 200 to 400° C.;
   pressure: from about 500 to 1500 mTorr; and
   time: from about 120 to 240 seconds.

58. The method of claim 47, wherein the surface native oxide Layer is from about 5 to 30 Å thick.

59. The method of claim 47, wherein the surface native oxide layer is from about 10 to 20 Å thick.

60. The method of claim 47, wherein the exposed upper portion of the initial bump side walls extends from about 3 to 100 μm from the initial bump top surfaces.

61. The method of claim 47, wherein the exposed upper portion of the initial bump side walls extends from about 5 to 15 μm from the initial bump top surfaces.

* * * * *